United States Patent [19]

Sasaki

[11] Patent Number: 4,837,782
[45] Date of Patent: Jun. 6, 1989

[54] CMI DECODER

[75] Inventor: Eisaku Sasaki, Tokyo, Japan

[73] Assignee: NEC Corporation, Japan

[21] Appl. No.: 181,446

[22] Filed: Apr. 14, 1988

[30] Foreign Application Priority Data

Apr. 21, 1987 [JP] Japan .................................. 62-96318

[51] Int. Cl.$^4$ ............................................. H03M 7/14
[52] U.S. Cl. ........................................ 375/95; 375/25;
375/49; 360/43; 341/73
[58] Field of Search ....................... 375/17, 19, 22, 25,
375/49, 84, 87, 20, 94, 95; 360/42, 43, 45;
340/347 DD; 329/111

[56] References Cited

U.S. PATENT DOCUMENTS 3,953,673  4/1976  Dorward ................................. 375/19
4,071,692  1/1978  Weir et al. ............................. 375/17
4,562,422  12/1985  Pospischil .............................. 360/44
4,651,328  3/1987  den Hollander et al. ............. 375/25

FOREIGN PATENT DOCUMENTS 0209306  1/1987  European Pat. Off. .

Primary Examiner—Benedict V. Safourek
Assistant Examiner—Stephen Chin
Attorney, Agent, or Firm—Laff, Whitesel, Conte & Saret

[57] ABSTRACT

In a digital communication system, a CMI (Coded Mark Inversion) decoder for extracting an optimum sampling timing from a CMI coded input signal so as to NRZ (Non-Return to Zero) format the input signal. A circuit for producing clock signals which are individually deviated in phase by $+\frac{1}{4}$ and $-\frac{1}{4}$ of a period relative to a reference clock signal that is extracted from the input signal is constituted by a logic circuit.

5 Claims, 3 Drawing Sheets

CMI DECODER

BACKGROUND OF THE INVENTION

The present invention relates to a decoder included in a digital communication system for decoding a digitized signal to produce a CMI (Coded Mark Inversion) coded signal and, more particularly, to a decoder for extracting an optimum sampling timing from a CMI coded input signal so as to transform the input signal into a NRZ (Non-Return to Zero) format.

Generally, a signal digitized by coding is subjected to coding of a kind which matches with the characteristics of a particular transmission path before being sent out to the transmission path. Various kinds of coding schemes have heretofore been proposed for such a purpose and include bi-phase coding, typical of which is CMI coding. The principle of CMI coding is such that NRZ codes of "1, 1" and "0, 0" (indicated by using one half of a time slot T for signal transmission as a unit) are alternatively assigned to "1" of an input binary signal, or original data signal, while one of NRZ codes of "0, 1" and "1, 0" each having a phase transition point at the center of a time slot for signal transmission is assigned to "0" of the input binary signal. A prior art CMI decoder adapted to decode such CMI codes is constituted by a first flip-flop circuit to which an input signal is applied, a low pass filter to which an output of the first flip-flop circuit is coupled, a voltage controlled oscillator (VCO) to which an output of the low pass filter is fed, first to third delay lines to which an output of the VCO is applied, and the first flip-flop circuit and a second and a third flip-flop circuit to which outputs of the first to third delay lines respectively are delivered. A drawback with this kind of decoder is that the delay lines have to be adjusted one by one at the instant when clock signals whose phases are individually deviated by $+T/4$ and $-T/4$ from the phase of a clock signal extracted from an input signal, resulting in poor operability. Another drawback is that the decoder is not feasible for an integrated circuit configuration because each of the delay lines is implemented with an analog circuit.

SUMMARY OF THE INVENTION

It is therefore an object of the present invention to provide a CMI decoder for a digital communication system which is capable of extracting a stable clock signal from a CMI coded input signal and producing clock signals which are individually different in phase by $+T/4$ and $-T/4$ from the extracted clock signal without resorting to adjustment.

It is another object of the present invention to provide a CMI decoder for a digital communication system which can be configured into an integrated circuit.

It is another object of the present invention to provide a generally improved CMI decoder.

A decoder included in a digital communication system for decoding a digitized signal into a CMI (Coded Mark Inversion) coded signal of the present invention comprises a voltage controlled oscillator (VCO) $\frac{1}{2}$ frequency dividing means for dividing an output of the VCO, first logic means supplied with an output of the VCO and an output of the $\frac{1}{2}$ frequency dividing means for producing three clock signals, two of the three clock signals being individually deviated in phase by $+\frac{1}{4}$ and $-\frac{1}{4}$ of a period relative to a reference clock signal which is remaining one of the three clock signals, first discriminating means for sampling a CMI coded input signal by the clock signal which is deviated by $+\frac{1}{4}$ of a period and outputted by the first logic means, second discriminating means for sampling the input signal by the reference clock signal, the VCO being controlled by an output of the second discriminating means, and third discriminating means for sampling the input signal by the clock signal which is deviated by $-\frac{1}{4}$ of a period, and second logic means supplied with outputs of the first second and third discriminating means for producing a NRZ format signal.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
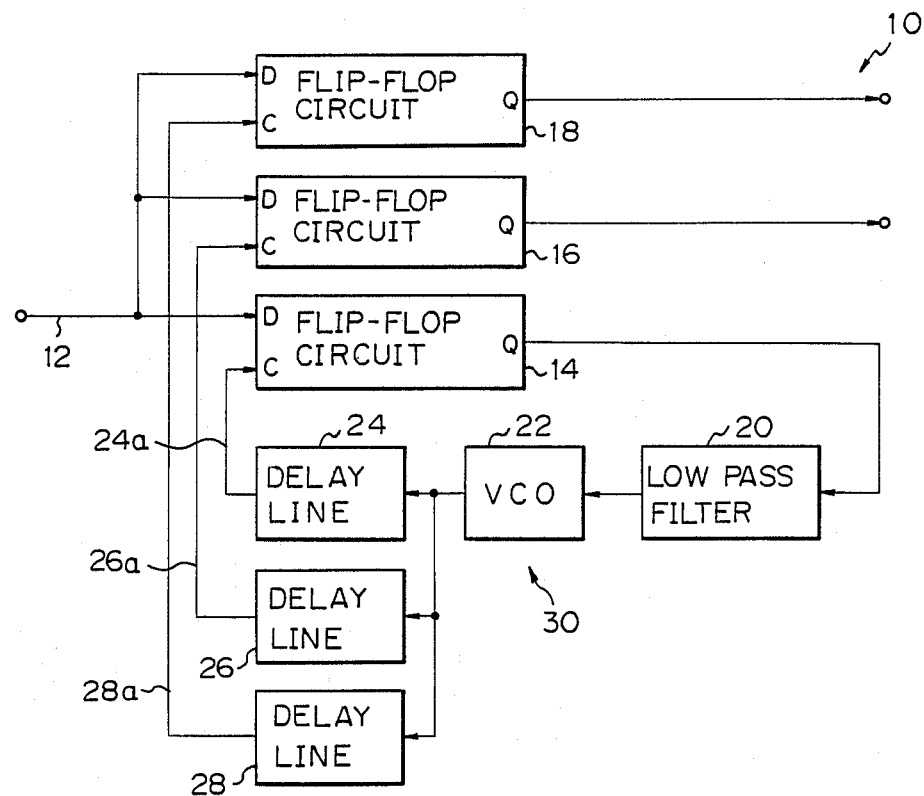
FIG. 1 is a block diagram schematically showing a part of a prior art CMI decoder.

To better understand the present invention, a brief reference will be made to a prior art CMI decoder, shown in FIG. 1. As shown, the prior art CMI decoder 10 includes three flip-flop circuits 14, 16 and 18, a low pass filter 20 connected to an output of the flip-flop circuit 14, a voltage controlled oscillator (VCO) 22 connected to an output of the low pass filter 20, and three delay lines 24, 26 and 28 connected to an output of the VCO 22. Outputs 24a, 26a and 28a of the delay lines 24, 26 and 28 are coupled to the flip-flop circuits 14, 16 and 18, respectively. The flip-flop circuit 14, low pass filter 20, VCO 22 and delay line 24 in combination constitute a timing extracting circuit 30.

Figure 2:
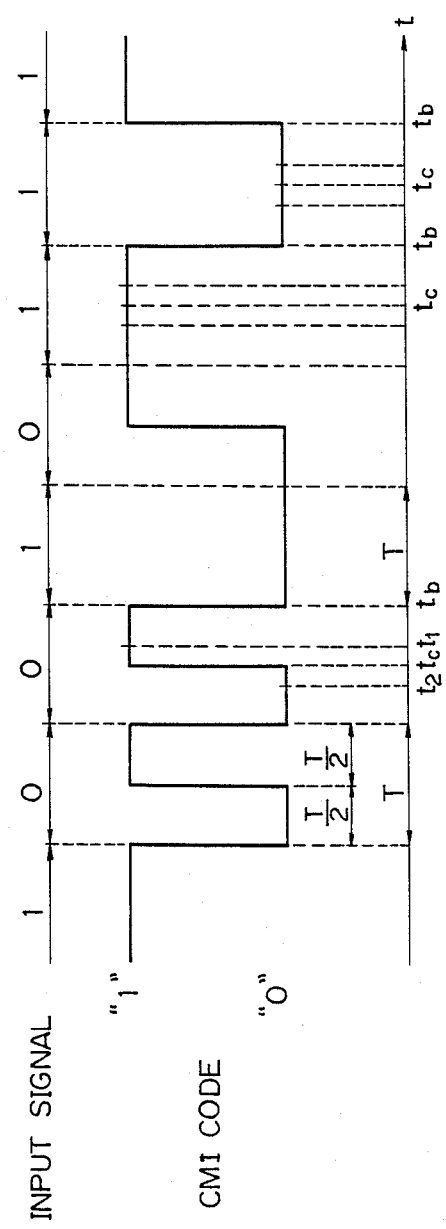
FIG. 2 is a waveform diagram representative of exemplary CMI codes.

The operation of the timing extracting circuit 30 will be described with reference to FIG. 2 which is representative of exemplary CMI codes. As shown, the circuit 30 assigns to "0" of an input signal or original data signal 12 a code of "0, 1" having two times higher bit rate than the former while assigning to "1" of the input signal 12 a code of "1, 1" of "0, 0", the codes "1, 1" and "0, 0" being transmitted alternately. As shown in the diagram of FIG. 2, the logical level of the CMI coded signal goes positively (i.e. from "0" to "1") at the intermediate point $t_c$ of all the time slots T of the input signal 12. Hence, the output of the flip-flop circuit 14 becomes "1" which the phase of the output 24a of the delay line 24 is slightly advanced relative to $t_c$ as represented by a time $t_1$ and becomes "0" when the former is slightly delayed relative to the latter as represented by a time $t_2$. It follows that the output 24a of the delay line 24 will be locked to $t_c$ if the output of the VCO 22 is lowered when the output of the flip-flop 14 is "1" and raised when the latter is "0" via the low pass filter 20.

When the input signal 12 is "1", the logical level of the CMI coded signal is not changed and therefore the control signal is not effected. At a point $t_b$ where nearby time slots border on each other, although the logical level goes both positively and negatively, the output 24a is not locked to $t_b$ because the positive and negative transitions do not occur with regularity. Only if the delay times of the delay lines 24, 26 and 28 which are analog circuits are selected such that the phase of the output 26a of the delay line 26 is delayed by T/4 relative to the that of the output 24a while the phase of the output 28a of the delay line 28 is advanced by T/4 relative to the output 24a, the input signal 12 can be automatically sampled at an optimum timing by the flip-flop circuits 16 and 18. The CMI code is decoded by comparing the outputs of the flip-flop circuits 16 and 18.

The prior art CMI decoder 10 described above is disadvantageous for the previously described reasons. Specifically, when clock signals which are individually deviated in phase by +T/4 and −T/4 relative to the clock signal which is extracted from the input signal 12 are to be produced, it is necessary for the delay lines to be individually adjusted. In addition, since each of the delay lines is implemented with an analog circuit, the CMI decoder 10 is not feasible for integration.

The prior art CMI decoder is disclosed in, for example, European patent publication No. 0 209 306 filed by NEC Corporation.

Figure 3:
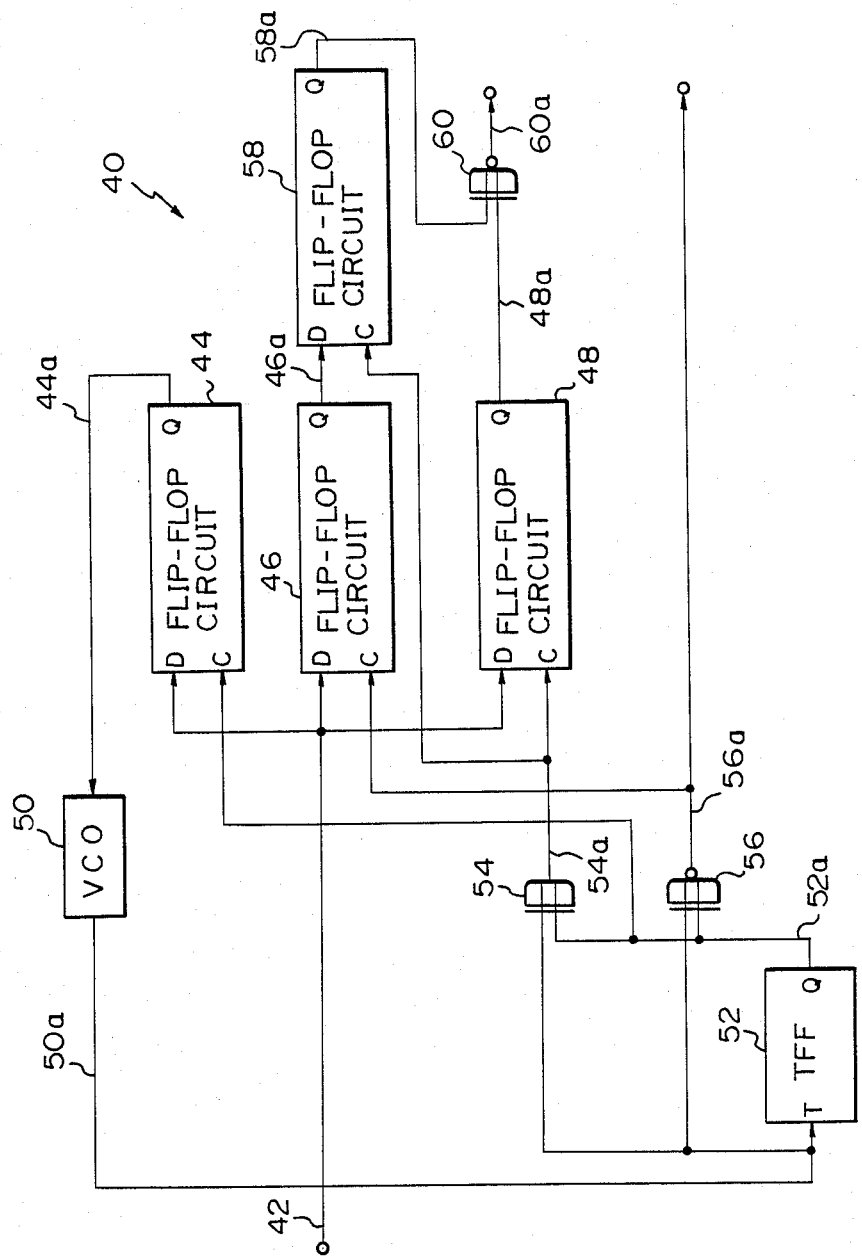
FIG. 3 is a schematic block diagram showing one embodiment of a CMI decoder in accordance with the present invention.

Referring to FIG. 3, a CMI decoder embodying the present invention is shown and generally designated by the reference numeral 40. As shown, the CMI decoder 40 is made up of three flip-flop circuits 44, 46 and 48 which are each supplied with an input signal or original data signal 42, a VCO 50 to which an output 44a of the flip-flop circuit 44 is applied, a toggle flip-flop circuit 52 to which an output 50a of the VCO 50 is supplied, an Exclusive-OR (EX-OR) gate 54 and an Exclusive-NOR (EX-NOR) gate 56 to both of which are supplied the output 50a of the VCO 50 and an output 52a of the flip-flop circuit 52, a flip-flop circuit 58 to which an output 46a of the flip-flop circuit 46 and an output 54a of the EX-OR gate 54 are supplied, and an EX-NOR gate 60 to which an output 58a of the flip-flop circuit 58 and an output 48a of the flip-flop circuit 48 are fed. The EX-NOR gates 60 and 56 produce outputs 60a and 56a, respectively. Further, the output 52a of the flip-flop 52 and the output 56a of the EX-NOR gate 56 are routed to the flip-flops 44 and 46, respectively.

The output 50a of the VCO 50 is a clock signal having a frequency $2f_0$ which is twice as high as the frequency $f_0$ of the input signal or original data signal 42. The toggle flip-flop circuit 52 divides the frequency of the signal 50a to produce a clock signal 52a whose frequency is $f_0$. Supplied with the clock signals 50a and 52a, the EX-OR gate 54 outputs a clock signal 54a which is delayed in phase by T/4 relative to the clock signal 52a. The EX-NOR gate 56 is supplied with the clock signals 50a and 52a to produce a clock signal 56a which is advanced in phase by T/4 relative to the clock signal 52a. Clocked by the signal 52a, the flip-flop circuit 44 samples the input signal 42 and controls the VCO 50 with its output such that the signal 52a is located at the intermediate point $t_c$ of the time slot T of the input signal 42. At the time when the clock signal 52a is locked to $t_c$, each of the signals 54a and 56a has become an optimum clock signal for sampling the input signal 42. The flip-flop circuit 46 samples the input signal 42 by the clock signal 56a while the flip-flop circuit 48 samples the input signal 42 by the clock signal 54a. Since the output 46a of the flip-flop circuit 46 has been advanced by T/2 relative to the output 48a of the flip-flop circuit 48, the flip-flop circuit 58 samples the flip-flop output 46a by the clock signal 54a so that the output 46a may coincide with the output 48a. The EX-NOR gate 60 compares the outputs 58a and 48a of the flip-flop circuits 58 and 48, respectively, which are now coincident with each other, thereby outputting an NRZ format signal 60a. At this instant, the signal 56a has become an optimum clock signal for sampling the signal 60a.

In the event that the frequency of the clock signal 50a is divided by the toggle flip-flop circuit 52, the clock signal 52a goes positively sometimes simultaneously with the first positive-going edge of the clock signal 50a and sometimes later than the latter by T/2, depending upon the initial state of the toggle flip-flop 52. Nevertheless, since the relative relationship between the clock signals 54a, 52a and 56a with respect to time remains the same, the input signal is decoded correctly with no regard to the initial state of the toggle flip-flop circuit 52 after the clock signal 52a has been locked to $t_c$ by the VCO 50.

In summary, it will be seen that the present invention provides a CMI decoder which eliminates the need for adjustment and can be constructed into an integrated circuit because a circuit adapted to produce an optimum clock signal for sampling an input signal is constituted by a logical circuit.

Various modifications will become possible for those skilled in the art after receiving the teachings of the present disclosure without departing from the scope thereof.

What is claimed is:

1. A decoder for decoding a digitized signal into a CMI (Coded Mark Inversion) coded signal, comprising:
    a voltage controlled oscillator (VCO);
    ½ frequency dividing means for dividing an output of said VCO;
    first logic means supplied with an output of said VCO and an output of said ½ frequency dividing means for producing three clock signals, two of said three clock signals being individually deviated in phase by +¼ and −¼ of a period relative to a reference clock signal which is a remaining one of the three clock signals;
    first discriminating means for sampling a CMI coded input signal by the clock signal which is deviated by +¼ of a period and outputted by said first logic means;
    second discriminating means for sampling the input signal by the reference clock signal, said VCO being controlled by an output of said second discriminating means; and
    third discriminating means for sampling the input signal by the clock signal which is deviated by −¼ of a period; and
    second logic means supplied with an output of said first discriminating means and an output of said third discriminating means for producing a NRZ (Non-Return to Zero) format signal.

2. A decoder as claimed in claim 1, wherein said ½ frequency dividing means comprises a toggle flip-flop circuit.

3. A decoder as claimed in claim 1, wherein said first logic means comprises an Exclusive-OR gate and an Exclusive-NOR gate.

4. A decoder as claimed in claim 1, wherein each of said first discriminating means, said second discriminating means and said third discriminating means comprises a flip-flop circuit.

5. A decoder as claimed in claim 1, wherein said second logic means comprises an Exclusive-NOR gate.

* * * * *